(12) United States Patent
Kang

(10) Patent No.: US 10,615,623 B2
(45) Date of Patent: Apr. 7, 2020

(54) CAPACITOR QUICK-CHARGE APPARATUS

(71) Applicant: DOOHYUN INFRA CO., LTD, Seoul (KR)

(72) Inventor: Eui Suk Kang, Changwon-si (KR)

(73) Assignee: DOOHYUN INFRA CO., LTD, Seoul (KR)

( * ) Notice: Subject to any disclaimer, the term of this patent is extended or adjusted under 35 U.S.C. 154(b) by 0 days.

(21) Appl. No.: 16/041,622

(22) Filed: Jul. 20, 2018

(65) Prior Publication Data

US 2019/0070965 A1    Mar. 7, 2019

(30) Foreign Application Priority Data

Jul. 20, 2017   (KR) .................. 10-2017-0091794

(51) Int. Cl.
| | |
|---|---|
| H02J 7/00 | (2006.01) |
| B60L 50/40 | (2019.01) |
| H02J 7/34 | (2006.01) |
| H02J 7/04 | (2006.01) |
| H03K 5/24 | (2006.01) |
| G01R 31/64 | (2020.01) |
| G01R 31/392 | (2019.01) |

(52) U.S. Cl.
CPC ......... *H02J 7/00711* (2020.01); *B60L 50/40* (2019.02); *H02J 7/0022* (2013.01); *H02J 7/045* (2013.01); *H02J 7/345* (2013.01); *H03K 5/24* (2013.01); *G01R 31/392* (2019.01); *G01R 31/64* (2020.01); *Y02T 10/7005* (2013.01); *Y02T 10/7022* (2013.01); *Y02T 10/7241* (2013.01); *Y02T 10/92* (2013.01); *Y02T 90/127* (2013.01)

(58) Field of Classification Search
CPC .......... H02J 7/0093; H02J 7/045; B60L 50/40
USPC ................................ 320/143, 145, 159, 166
See application file for complete search history.

(56) References Cited

U.S. PATENT DOCUMENTS

| 2004/0095118 A1* | 5/2004 | Kernahan ............. H02J 7/0065 |
| | | 323/282 |
| 2007/0194759 A1* | 8/2007 | Shimizu ................ H02J 7/0016 |
| | | 320/166 |
| 2009/0230926 A1 | 9/2009 | Yang et al. |

FOREIGN PATENT DOCUMENTS

| JP | 2002281685 B2 | 9/2002 |
| JP | 2004336919 A | 11/2004 |
| KR | 10-2008-0855871 B1 | 8/2008 |
| KR | 1020090097828 A | 9/2009 |
| KR | 10-2015-0063427 A | 6/2015 |
| WO | 2014057724 A1 | 4/2014 |

* cited by examiner

*Primary Examiner* — Edward Tso
*Assistant Examiner* — Aaron Piggush
(74) *Attorney, Agent, or Firm* — Goldilocks Zone IP Law

(57) ABSTRACT

The capacitor quick-charge apparatus includes an input AC power source, a phase modulator, a rectifier, a shunt, a module current supply, a current control element, a capacitor, a resistance, a comparator, a variable resistor, an Operational Amplifier 1 (OP AMP 1) to an Operational Amplifier 5 (OP AMP 5), an Auto Voltage Regulator (AVR) or a Micro Control Unit (MCU), and a monitor system.

8 Claims, 2 Drawing Sheets

CAPACITOR QUICK-CHARGE APPARATUS

CROSS-REFERENCE TO RELATED APPLICATIONS

This application claims priority under 35 U.S.C. § 119 to Korean Patent Application No. 10-2017-0091794 filed on Jul. 20, 2017 in the Korean Intellectual Property Office, the disclosure of which is incorporated herein by reference in its entirety.

TECHNICAL FIELD

The present invention relates to a capacitor charge apparatus, and more particularly, to a capacitor charge apparatus capable of rapidly charging and storing charge energy for a long time by interrupting an excessive deterioration current of a protection circuit, a smoothing circuit, during charging of a capacitor.

BACKGROUND ART

Generally, a battery capable of charge and discharge is referred to as a secondary battery, of these lithium secondary batteries, lithium manganese, lithium nickel, lithium cobalt, lithium iron phosphate, and the like, which are high in energy density and productivity. These secondary batteries are charged by a single or multiple secondary battery modules and a charger for charging.

Particularly, the capacitor module may include a method of charging and protecting each secondary cell of a cell voltage balance circuit, a method of supplying power to the cell alone, cutting off the battery when the charging is completed.

A Battery Management System (BMS) that performs many functions necessary for battery management in addition to a basic protection function of a Protection Circuit Module (PCM) that controls charging a voltage and a temperature by combining the protection method and use the charger to control the charging either internally or externally.

Generally, the charger supplies a power slightly higher than a power of the battery by rapid charging and a Constant Current (CC) or a Constant Voltage (CV) method, and the charging time is different from each other according to a state of a battery charging voltage and a final discharge voltage.

When the battery is rapidly charged, the battery is supplied with a voltage slightly higher than a voltage of the battery, and the battery is charged, that is, chemically reduced by a potential difference. A full-charge is detected the battery can be controlled as charge completed. In this case, the charging voltage, that is, the heat accompanying the chemical reduction when charging the secondary battery, causes the charging time of the battery to be excessive, and the deterioration phenomenon causes the explosion or not making the energy density of the battery higher.

It is necessary to provide at least two hours of charging time, which is somewhat different depending on a type of rechargeable battery.

In order to reduce the heat generated by charging and reduction, a natural cooling such as an air-cooled and a convection type and forced cooling type using water or gas are used. The electricity used for cooling the heat is inefficient while charging the battery.

However, in a portable power supply apparatus, a charging device using a capacitor rather than a charging device using a secondary battery may enable a much more economical energy storage.

That is, capacitors can be rapidly charged, and there is very little deterioration that wastes energy or shortens the life time of the battery not like a secondary battery. Therefore, it can be used as a permanent storage device, a portable electric storage device, or an emergency power supply.

However, when the capacitors are composed as parallel circuits or serial circuits, a voltage smoothing circuit may be generally composed of a resistor, a semiconductor such as a transistor (TR) or a Field Effect Transistor (FET), and a voltage is smoothed for each of the capacitors. In this case, a current flow in the smoothing circuit that can cause excessive heat because a resistor of each capacitors is very low.

This current is a major cause of the burnout of the protection smoothing circuit of the capacitor, which neither protects the capacitor but also provides a large power supply for rapid charging in a short time, it is difficult to form a parallel circuit or a serial circuit.

The cost of manufacturing a durable power module for solving this problem is also a major cause of the increase, and it is a major cause of shortening the charge energy storage time of the capacitor by consuming the power of the capacitor charged in the balance circuit itself.

On the other hand, Korean Patent Registration No. 10-0855871, issued on Aug. 27, 2008, titled "applicant describes a rechargeable power supply device having a charging capacitor and a control method thereof."

However, the above patented technology, there is no safety device for rapid charging such as a protection circuit of a capacitor such as an active balance, a smoothing circuit, which requires for the implementation of a large-capacity capacitor charging device used for a discharge time limit due to the use of a single capacitor and a load requiring an instantaneous starting torque such as an electric vehicle (EV).

Technical Problem

The present invention has been made in view of the above problems, and it is therefore an object of the present invention to simplify a smoothing circuit for protecting a capacitor by a resistor, to check a charged current by checking a cell voltage, and to include a circuit for checking a state of being charged in the battery.

It is an object of the present invention to provide a capacitor quick-charge apparatus capable of storing electric energy charged in a capacitor for a long time as well as stable rapid charging.

Technical Solution

According to an aspect of the present invention, there is provided a capacitor quick-charge apparatus including: a phase modulator 100 for shortening a charging time by modulating a phase of a voltage waveform with respect to an input power supply AC, and consequently controlling a DC voltage and a DC current intensity.

A capacitor quick-charge apparatus may include a rectifier 200 for converting a phase-modulated AC voltage through the phase modulator into a DC voltage and acting as a noise filter and a shunt 300 connected in parallel to the circuit for detecting a DC voltage through the rectifier to widen a measurement range of the current and to detect an error according to an aspect of the present invention.

A capacitor quick-charge apparatus may include a current supply 400 for passing an error-free current through the shunt 300 to a capacitor module having a serial-parallel circuit 600 and a current control device 500 selected from any one of IGBT, TR, and FET for controlling the current supplied to the capacitor 600 of the capacitor module having the serial-parallel circuit through the current supply 400 according to an aspect of the present invention.

A capacitor quick-charge apparatus may include a capacitor 600 serving as an ultra-quick charging medium in place of the existing secondary battery by the current outputted from the current control device; a resistor 700 for protecting the capacitor from the current that may cause excessive heat to the smoothing circuit and enabling an active balancing charge on the capacitor according to an aspect of the present invention.

A capacitor quick-charge apparatus may include a comparator 800 that compares the voltage across both ends of the shunt 300 with an equilibrium value of a voltage across the variable resistor 900 and transmits the result to the phase modulator to convert the value of current flowing to the capacitor to control rapid charging, and a variable resistor 900 having a passive protection circuit function to manually set a symmetric value of a voltage when the input power source AC and the capacitor are serially connected according to an aspect of the present invention.

A capacitor quick-charge apparatus may include an operational amplifier 1 (OP AMP 1) 1100 for amplifying a symmetry value of the voltage controlled by the variable resistor, an operational amplifier 2 (OP AMP 2) 1200 for amplifying a current value supplied from the shunt, and an Automatic Voltage Regulator (AVR) or a Micro Computer Unit (MCU) 1600 having a second automatic protection circuit function for receiving a signal of an Operational Amplifier 3 (OP AMP 3) 1300 and confirming a charge initial voltage and a charge end voltage of the capacitor according to an aspect of the present invention.

A capacitor quick-charge apparatus may include wherein when the waveform of the signal pulse transmitted from the AVR is a manual control, a rapid charging of the capacitor is performed by comparing the current value adjusted by the variable resistor, and the waveform of the signal pulse transmitted from the AVR is automatically controlled, and a Pulse Width Modulation (PWM) generator for control is performed so that rapid charge control of the capacitor is performed according to the phase-modulated current value in accordance with the signal output from the comparator, thereby securing the stability in accordance with rapid charging of the capacitor. And a modulator generator 1000 are provided in the capacitor.

According to another embodiment of the present invention, the input power may be inputted in a range of AC 220V to 380V and may be a high voltage in a range of 440V to 1,000V when an electric vehicle charge.

According to another embodiment of the present invention, the current control device 500 may be configured to perform an ultra-quick charge by keeping the final discharge voltage constantly according to the charging of the capacitors 600 and correct the voltage error range of each cell, capacitors, generated in the cell.

According to another embodiment of the present invention, the current control device 500 has a cut-off and bypass function for controlling a voltage and a current input to the capacitor 600.

According to another embodiment of the present invention, the capacitor quick-charge apparatus may have a function of Internet of Things (IoT).

The apparatus may include a monitor system 1700, which allows the user to check a charge amount of the capacitors based upon a signal amplified by the OP AMP 1 to OP AMP 3 transferred through the AVR and confirm the electricity usage fee and the abnormality of the rapid charging device in accordance with the charging operation in conjunction with the control unit of the electric vehicle charger.

According to another embodiment of the present invention, the capacitor quick-charge device may further include n OP AMPs by adding n-3 OP AMPs to the OP AMP 1 to OP AMP 3 in parallel.

It is possible to check the presence or absence of an abnormality in each capacitor parallel circuit in the AVR by measuring the capacitor voltage for each phase of the large capacity charging device and also to calculate the data of the total charging power Data, and the data is programmed to calculate the current life of the capacitor and the future service life to inform the replacement period of the capacitor.

According to another embodiment of the present invention, when the small capacitor charging controller is manufactured, either the PWM generator 1000 or the comparator 800 maybe removed.

Effect of Invention

The capacitor quick-charge apparatus may expect the following effects according to an embodiment of the present invention.

The capacitor quick-charge apparatus may include a circuit device for interrupting a current which causes excessive heat of a protection circuit, smoothing circuit, due to a low resistance of a capacitor during charging according to an aspect of the present invention.

The capacitor quick-charge apparatus may include a high resistance component of the smoothing circuit, it is possible to intermit the current which generates excessive heat of the protection circuit due to the low resistance of the high capacity capacitor, so that the internal discharge of the capacitor or the power consumed by itself can be minimized.

High capacity capacitor have very little deterioration that wastes energy or shortens life span when charged like a battery, so the charge rate of the capacitor can be fast charged within a few seconds to several tens of minutes depending on an input voltage according to an aspect of the present invention.

A high capacity capacitor can be used as a multi-charger according to AC voltage and types of input, and they can be manufactured in a small size. There is a unique effect that can be applied to a variety of charge control devices capable of supplying emergency power sources such as a mountaineering device using a solar cell battery. Therefore, it can be used for wireless chargers including mobile storage devices, electric vehicles, electric bicycles, electric scooters, robots, drones and more.

DETAILED DESCRIPTIONS OF THE INVENTION

Figure 1:
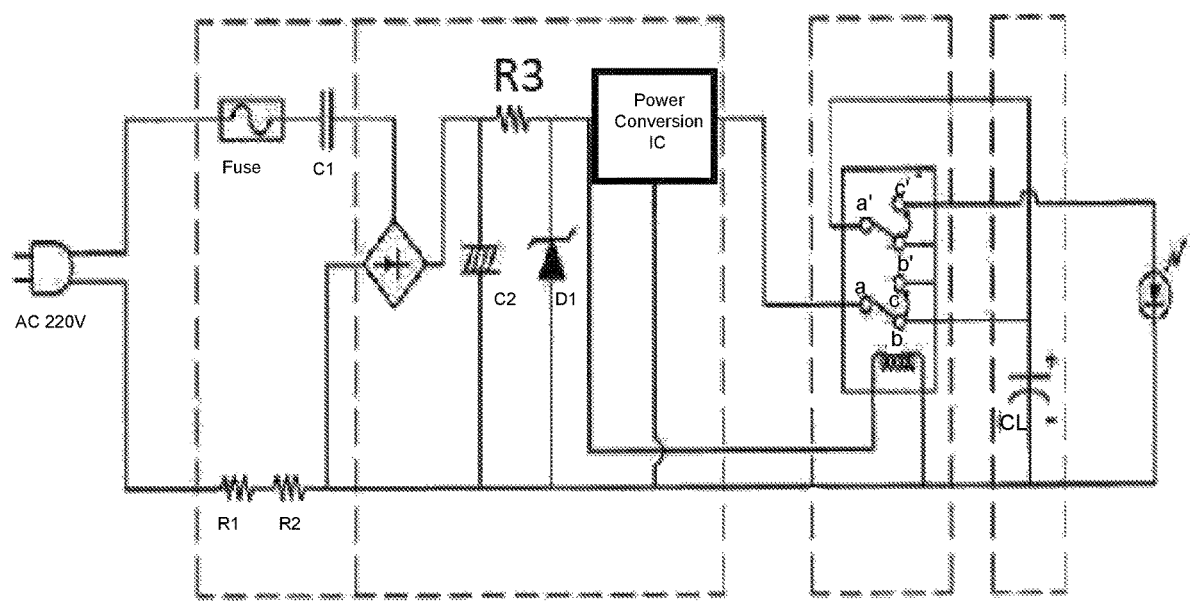
FIG. 1 shows a conventional capacitor charging apparatus.

Hereinafter, embodiments of the present invention will be described in detail with reference to the accompanying drawings. First, in adding reference numerals to the constituent elements of the drawings, it is to be noted that the same constituent elements are denoted by the same reference numerals even though they are shown in different drawings.

Figure 2:
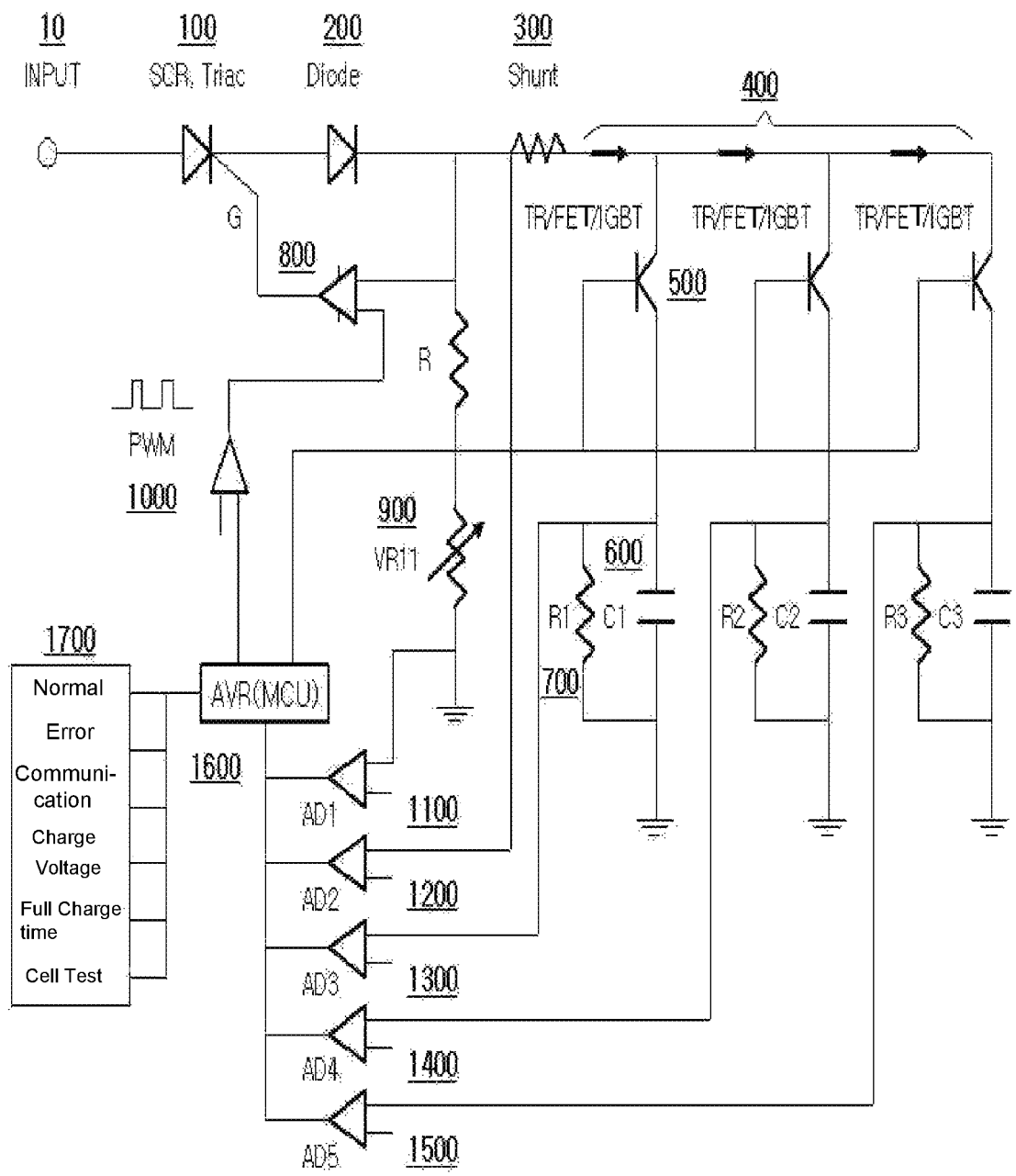
FIG. 2 is a circuit diagram showing the entire technical structure of a capacitor quick-charge apparatus according to a preferred embodiment of the present invention.

In the following description of the present invention, detailed description of known functions and configurations incorporated herein will be omitted when it may make the subject matter of the present invention rather unclear.

referring to FIG. 2, the capacitor quick-charge device may include an input AC power source 10, a phase modulator 100, a rectifier 200, a shunt 300, a module current supply 400, a current control element 500, a capacitor 600, a resistance 700, a comparator 800, a variable resistor 900, an Operational Amplifier 1 (OP AMP 1) to an Operational Amplifier 5 (OP AMP 5) 1100 to 1500), an Auto Voltage Regulator (AVR) or a Micro Control Unit (MCU) 1600, and a monitor system 1700 according to an embodiment of the present invention.

Referring to FIG. 2, the alternating current (AC) input from a numeral number 10, which is usually input at 220V to 380V, and, a high voltage of in a range of 440V to 1,000V is used as an input voltage in an Electric Vehicle charging.

First, a phase modulator 100 is for converting the phase of the voltage waveform with respect to the input power AC the phase is modulated by the phase modulator 100 to shorten the charging time since the input voltage is an AC.

It is also widely used for a constant DC voltage potential because the intensities of a DC voltage and a DC current can be controlled by adjusting a phase of the constant DC voltage potential.

Next, the rectifier 200 is for converting the phase-modulated AC voltage into the direct-current (DC) voltage through the phase modulator 100. The rectifier 200 may have a rectifying function and a noise filtering function, which blocks an electric noise included in a counter electromotive force.

The shunt 300 refers to a resistor connected to a circuit in parallel for detecting DC voltage through the rectifier 200 to widen the measurement range of the current and for error detection.

In addition, the current supply module 400 is a device or means for allowing an error-free current to flow from the shunt 300 to the capacitor module having the parallel circuit. However, it is not limited thereto.

The current control device 500 may include an element selected from any one of these elements such as an insulated-gate bipolar transistor (IGBT), a transistor (TR), or a field-effect transistor (FET) and controls a current supplied to capacitors 600 of the capacitor module having a parallel circuit through the current supply 400.

A quick-charge is performed by keeping the final discharge voltage of the capacitor 600 constantly in the current control device 500. In addition, the current control device may correct a voltage error range of each cell (capacitor) while performing the quick-charge.

Here, in order to prevent an overcurrent or a protection circuit, smoothing circuit, from being damaged due to a malfunction of an external device or an error of the external device, the current control device 500 may have an Over Current Protection and/or Detection Current function and cut off if a detected current is over a predetermined value, 1.5~3A if a small cell.

In addition, the current control device 500 may have a cut-off function for controlling an input voltage and current to the capacitor 600 according to an embodiment of the present invention.

The cut-off function is for confirming an instantaneous charging voltage. The current control device 500 may momentarily cut off the current to confirm a voltage across a high-capacity capacitor 600 and bypass when the instantaneous voltage rises.

Here, the bypass is for protecting the capacitor 600 when the device is overcharged, for an example, an Over Charge Protection Voltage maybe 4.25 to 4.35 V.

Also, the capacitor 600 is a charging medium may replace the conventional secondary battery by the current output from the current control device 500, and can be rapidly charged, since there is very little deterioration that wastes energy or shortens the life of the battery during charging. Thus, the capacitor can be used as a permanent storage device or as a portable electric storage device or an emergency power supply in all electronic equipment for charging.

a resistor 700 is a smoothing circuit for protecting the capacitor 600 and is for blocking a current that may generate an excessive heat in the smoothing circuit.

A smoothing operation of the resistor is to maintain a constant voltage on the cell voltage of each of the capacitors to enable an active balancing charge and a voltage supplied to each cell in a parallel circuit or a serial circuit having several tens or thousands of capacitors.

The reason why the active balancing charge is carried out is that when there is a variation in capacity among cells in a capacitor charging module applied to an Electric Vehicle (EV)/Hybrid Electric Vehicle (HEV) requiring a large starting torque, there is a possibility that a serious problem may occur in the large-capacity charging module because the charging states of the individual cells do not coincide with each other.

To solve this problem, it is necessary to have an active balancing function that exchanges a current among adjacent cells to equalize the charging state of the cells.

When the capacitor 600 is formed of a parallel circuit or a serial circuit, a voltage smoothing circuit is formed by using a semiconductor such as a resistor, a TR (Transistor), or a FET (Field Effect Transistor). In this case, the current that generates excessive heat flows to the smoothing circuit. Such a current burn out the smoothing circuit, and it is difficult to compose many parallel circuits or serial circuits for producing a high voltage as well as a large power supply for rapid charging.

In addition, there is a problem that the stored energy of the charged capacitor is not long-lasting.

Therefore, in the embodiment of the present invention, when a plurality of capacitors is composed by a parallel circuit or a serial circuit, a low resistance value of each capacitor is converted to have a high resistance value through the resistor 700.

Thus, the capacitors may have an active balancing function for exchanging a current through the resistor 700 among the cells, capacitors, and at the same time, the smoothing circuit protecting the capacitors may block a current, which may generate excessive heat.

The comparator 800 compares a voltage across both ends of the shunt 300 and an equilibrium value of the voltage across a variable resistor 900 and transmits the result to the phase modulator 100 to change the current value differently, thereby controlling the rapid charging.

The variable resistor 900 is a means for setting the symmetric value of the AC voltage inputted from the numeral 10 in FIG. 2 and a voltage at which the capacitor 600 if the capacitor is a serial circuit, is a means for manually setting the comparator 800 to compare an equilibrium value between a voltage across the shunt 300 and a voltage across the variable resistor 900.

The variable resistor 900 may enable a user to control a quick-charge of the capacitor 600 manually.

Referring to FIG. 2, a protection circuit function and a quick-charge stability of the capacitor quick-charge apparatus according to an embodiment of the present invention will be described in detail.

First, as described above, the variable resistor 900 manually sets a symmetric value of a voltage when the input power supply AC and the capacitor 600 are composed as a serial circuit, thereby achieving a primary passive circuit protection function.

Next, the symmetric value of the voltage controlled by the variable resistor 900 is amplified by the OP AMP 1 1100, and then checking an initial charge voltage and a final discharge voltage of the capacitor 600 in the AVR or MCU 1600.

Amplifying a current by the OP AMP 2 1200 since the current value supplied from the shunt 300 is not large, and then checking the initial charge voltage and the final discharge voltage of the capacitor 600 at the AVR or the MCU 1600.

In addition, amplifying a voltage of both ends, a resistor 700 and the capacitor 600 at the OP AMP 3 1300, and then checking the initial charge voltage and the final discharge voltage of the capacitor 600 in the AVR or MCU 1600.

Accordingly, the capacitor 600 may have functions to check the initial charge voltage and the final discharge voltage of the capacitor and to protect the circuit.

In other words, according to an embodiment of the present invention, the capacitor 600 may include an OP AMP 1 1100 for amplifying the symmetric value of the voltage regulated by the variable resistor 900 and an OP AMP 2 1200 for amplifying the current value supplied from the shunt 300, and an OP AMP 3 1300 for amplifying a voltage across a resistor 700 and the capacitor 600, and checking the charging start voltage and the final discharge voltage of the capacitor 600, thereby the capacitor 600 having a secondary automatic protection circuit.

If the waveform of the signal pulse sent to the Pulse-Width Modulation (PWM) generator 1000 via the AVR or MCU 1600 for confirming the initial charge voltage and the final discharge voltage of the capacitor 600 is manually controlled, the capacitor 600 is rapidly charged by comparing the current value adjusted by the variable resistor 900.

When the current value is an automatic control waveform, the rapid charge control of the capacitor 600 is enabled according to a phase-modulated current value based upon the signal output from the comparator 800. Thus, thirdly, a stability of the capacitor 600 is secured due to a quick-charge of the capacitor 600.

In other words, the capacitor quick-charge apparatus may include: when the waveform of the signal pulse transmitted from the AVR 1600 is a manual control, a quick-charge of the capacitor 600 is performed by comparing the current value adjusted by the variable resistor 900, when the waveform of the signal pulse transmitted from the AVR 1600 is an automatic control, the quick-charge control of the capacitor 600 is performed according to the phase-modulated current value according to the signal output from the comparator, thereby thirdly, a unique feature that ensures stability with the quick-charge of the capacitor according to an aspect of the present invention.

Here, when a small-sized capacitor charging controller is manufactured, a manufacturing cost of the capacitor quick-charge apparatus can be reduced by removing either the PWM generator 1000 or the comparator 800.

Referring to FIG. 2, when a plurality of the capacitors 600 are used to form a parallel circuit, that is an OP AMP 4 1400, OP AMP 5 1500, . . . and OP AMP n are added in parallel to charge a large capacity, by measuring the capacitor voltage for each phase of the device, it is possible to check a presence or an absence of an abnormality in the capacitor parallel circuit.

That is, when the measured voltage is amplified by the OP AMP 5 to the OP AMP n and then a signal is transmitted to the AVR or MCU 1600, and the AVR or MCU 1600 may check an abnormality of each parallel circuit of the capacitor and easily repair the parallel circuits of the capacitor more quickly.

In the AVR or MCU 1600, the measured data of the total charge power is obtained by summing the measured capacitor voltages, and the data is programmed to calculate a current life of the capacitor and a service life of the capacitor in the future, thereby informing a replacement period of the capacitor is possible.

Meanwhile, the monitor system 1700 may have an Internet of Things (IoT) function and transmit a value amplified in the OP AMP 1 to OP AMP 5 through the AVR or MCU 1600. The user may check a charge amount of the capacitor transferred through the AVR, a usage fee, and an abnormality of the rapid charging device according to an embodiment of the present invention.

It will be apparent to those skilled in the art that various modifications and variations can be made in the present invention without departing from the spirit or essential characteristics thereof. Therefore, the embodiments disclosed in the present invention are intended to illustrate rather than limit the scope of the present invention, and the scope of the technical idea of the present invention is not limited by these embodiments. The scope of protection of the present invention should be construed according to the following claims, and all technical ideas within the scope of the same should be interpreted as being included in the scope of the present invention.

EXPLANATIONS OF SYMBOLS

10: input power supply (AC)
100: phase modulator
200: rectifier
300: shunt
400: current supply
500: current control device
600: capacitor
700: resistor
800: comparator
900: variable resistor
1000: power width modulation (PWM) generator
1100~1500: operational amplifier OP AMP 1~OP AMP 5
1600: automatic voltage regulator (AVR) or micro control unit (MCU)
1700: monitor system

What is claimed is:
1. A capacitor quick-charged apparatus, the apparatus comprising:
 a phase modulator configured to modulate a phase of a voltage waveform with respect to an input power source AC to control an intensity of a direct voltage (DV) and a direct current (DC), thereby shortening a charging time;

a rectifier configured to convert a phase-modulated AC voltage through the phase modulator into a DC voltage and acting as a noise filter;

a shunt connected to the rectifier in parallel for detecting the DC voltage through the rectifier to broaden a measurement range of a current and to detect an error;

a current supply configured to pass the current received from the shunt therethrough to capacitors;

a current control device configured to control the current supplied to the capacitors from the current supply;

the capacitors configured to being charged from the current outputted from the current control device;

a resistor configured to block an access current generating an excessive heat in a smoothing circuit device for protecting the capacitors;

a comparator configured to compare a voltage across both ends of the shunt and a voltage across a variable resistor with an equilibrium value, and to transmit a compared result to the phase modulator for changing a value of the current flowing to the capacitors to control rapid charging;

a variable resistor having a passive protection circuit function configured to manually set a symmetric value of a voltage if the input power source AC and the capacitors are connected serially;

a first operational amplifier (OP AMP 1) configured to amplify a symmetric value of the voltage controlled by the variable resistor;

a second operational amplifier (OP AMP 2) configured to amplify the current value supplied from the shunt;

a third operational amplifier (OP AMP 3) configured to amplify a voltage between ends of the capacitors; and an automatic voltage regulator (AVR) having an automatic protection circuit function configured to receive a signal from the third operational amplifier (OP AMP 3) and to confirm an initial charge voltage and a final discharge voltage of the capacitor; and a Pulse-Width Modulation (PWM) generator configured to rapidly charge the capacitors by comparing the current value adjusted by the variable resistor according to the current value transmitted from the comparator if the waveform of the signal pulse transmitted from the AVR is a manual signal or rapidly charge the capacitors according to a phase modulated current based upon a signal outputted from the comparator if the waveform of the signal pulse transmitted from the AVR is an automatic control.

2. The capacitor quick-charge apparatus of claim 1, wherein the input power source (AC) is 220V to 380V and the electric power source is a high voltage of 440V to 1,000V when an electric vehicle (EV) is charged.

3. The capacitor quick-charge apparatus of claim 1, wherein the current control device maintains a final discharge voltage constantly according to the charging of the capacitors so that an ultra-rapid charge is performed and corrects an error range of among cells in the capacitors.

4. The capacitor quick-charge apparatus of claim 1, wherein the current control device has a cutoff and a bypass functions for controlling an input voltage and an input current to the capacitors.

5. The capacitor quick-charge apparatus of claim 1, the capacitor rapid charging apparatus further comprising:
a monitor system for allowing the user to check a charging amount of the capacitor by a signal amplified by the OP AMP 1 to OP AMP 3 and transmitted through the AVR, an electricity usage fee, and an abnormality of the capacitor rapid charging apparatus, thereby having a function of Internet of Things (IoT).

6. The capacitor quick-charge apparatus of claim 1, further comprising:
n-3 OP AMPs configured to add to the OP AMP 1 to OP AMP 3 in parallel to check a presence or an absence of abnormality in each capacitor in the AVR by measuring the capacitor voltage for each phase of the apparatus, to calculate data of the total charge power by summing the measured capacitor voltages, to calculate a current lifetime of the capacitor and a future service life based upon the calculated data, and to inform an replacement period of the capacitor to the user.

7. The capacitor quick-charge apparatus of claim 1, wherein the capacitor quick-charge charge apparatus removes any one of the PWM generator or the comparator when the apparatus is a small-sized capacitor quick-charge apparatus.

8. The capacitor quick-charge apparatus of claim 1, wherein the current control device is selected from any one of an Insulated gate bipolar transistor (IGBT), a Transistor (TR), and a Field Effect Transistor (FET).

* * * * *